(12) United States Patent
Chen et al.

(10) Patent No.: US 7,163,881 B1
(45) Date of Patent: Jan. 16, 2007

(54) METHOD FOR FORMING CMOS STRUCTURE WITH VOID-FREE DIELECTRIC FILM

(75) Inventors: Chih-Hsiang Chen, Portland, OR (US); Guo-Qiang Lo, Portland, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 95 days.

(21) Appl. No.: 10/863,533

(22) Filed: Jun. 8, 2004

(51) Int. Cl.
   *H01L 21/3205* (2006.01)
(52) U.S. Cl. .................. 438/595; 438/634; 257/E21.58
(58) Field of Classification Search .............. 438/595, 438/634, 640, 970; 257/E21.58
See application file for complete search history.

(56) References Cited

U.S. PATENT DOCUMENTS

| | | | |
|---|---|---|---|
| 5,119,164 A | 6/1992 | Sliwa, Jr. et al. | |
| 5,278,103 A | 1/1994 | Mallon et al. | |
| 5,296,092 A | 3/1994 | Kim | |
| 5,302,233 A | 4/1994 | Kim et al. | |
| 5,382,547 A | 1/1995 | Sultan et al. | |
| 5,393,708 A | 2/1995 | Hsia et al. | |
| 5,486,493 A | 1/1996 | Jeng | |
| 5,508,233 A | 4/1996 | Yost et al. | |
| 5,591,677 A | 1/1997 | Jeng | |
| 6,235,621 B1 * | 5/2001 | Jeng et al. | 438/592 |
| 6,566,236 B1 * | 5/2003 | Syau et al. | 438/595 |
| 6,740,549 B1 | 5/2004 | Chen et al. | |

* cited by examiner

*Primary Examiner*—Chandra Chaudhari
(74) *Attorney, Agent, or Firm*—Kenneth Glass; Glass & Associates

(57) ABSTRACT

A process for forming a void-free dielectric layer is disclosed in which adjoining gate film stacks are formed on a semiconductor substrate. Each gate film stack includes a silicide layer and a hard mask that overlies the silicide layer. A first selective etch is performed so as to reduce the width of the hard mask on each of the gate film stacks, exposing portions of the top surface of the silicide layer. A second selective etch is then performed to reduce the width of the silicide layer. Spacers are then formed on opposite sides of each of the gate film stacks, and a dielectric film is formed that extends over the gate film stacks. By reducing the width of the hard mask layer and the silicide layer, gate film stacks are obtained that have reduced width near the top of each gate film stack, preventing voids from forming in the dielectric film.

20 Claims, 10 Drawing Sheets

METHOD FOR FORMING CMOS STRUCTURE WITH VOID-FREE DIELECTRIC FILM

FIELD OF THE INVENTION

The present invention relates to the field of semiconductor devices. More particularly, the present invention relates to Complimentary Metal-Oxide Semiconductor (CMOS) manufacturing processes.

BACKGROUND ART

In sub-micron Complimentary Metal-Oxide Semiconductor (CMOS) manufacturing, self-aligned contact (SAC) technology has been successfully used to achieve chip size reduction. In conventional SAC processes gate film stacks are formed over the substrate, and spacers are formed on opposite sides of each gate film stack. An etch stop layer (e.g., silicon nitride) and a pre-metal dielectric layer are then deposited so as to cover the gate film stacks. An etch is performed to form contact openings that extend through the pre-metal dielectric layer. This etch stops on the etch stop layer. The exposed portions of the etch stop layer are then removed, exposing the structure that is to be contacted. A metal layer is then deposited and planarized to complete the self-aligned contact. The etch stop layer prevents over-etch, aligning the contact with the structure to be contacted and preventing current leakage that could result from improper alignment.

Side surfaces of conventional gate film stacks are nearly vertical, producing high-aspect ratio openings that must be filled by pre-metal dielectric. When pre-metal dielectric is deposited into these vertical or nearly vertical, high aspect ration openings, voids can form in the dielectric. These voids in the pre-metal dielectric layer can lead to bridging defects. More particularly, when the self-aligned contact etch opens up a void, metal can fill the void, causing undesired electrical contact between adjoining contacts and structures, causing current leakage. This results in reduced yield and increased manufacturing cost.

Accordingly there is a need for a process for forming a void-free dielectric film. Also, there is a need for CMOS devices that do not have bridging defects. The present invention meets the above needs.

DISCLOSURE OF THE INVENTION

A process for forming a void-free dielectric layer is disclosed in which adjoining gate film stacks are formed on a semiconductor substrate. Each gate film stack includes polysilicon layer, a silicide layer, and a hard mask that overlies the silicide layer. A first selective etch is performed so as to reduce the width of the hard mask on each of the gate film stacks, exposing portions of the silicide layer. A second etch is then performed to reduce the width of the silicide layer. Spacers are then formed on opposite sides of each of the gate film stacks, and a dielectric film is formed that extends over the gate film stacks.

As the process of the present invention reduces the width of the hard mask layer and the silicide layer, the profile of each gate film stack has reduced width near the top of each gate film stack as compared to the width at the bottom of the gate film stack. Accordingly, the space between adjoining gate film stacks that is to be filled by dielectric film is much easier to fill than that of prior art processes in which the gate film stacks have vertical sidewalls. Accordingly, the present invention prevents voids from forming in the dielectric film, preventing the occurrence of bridging defects.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
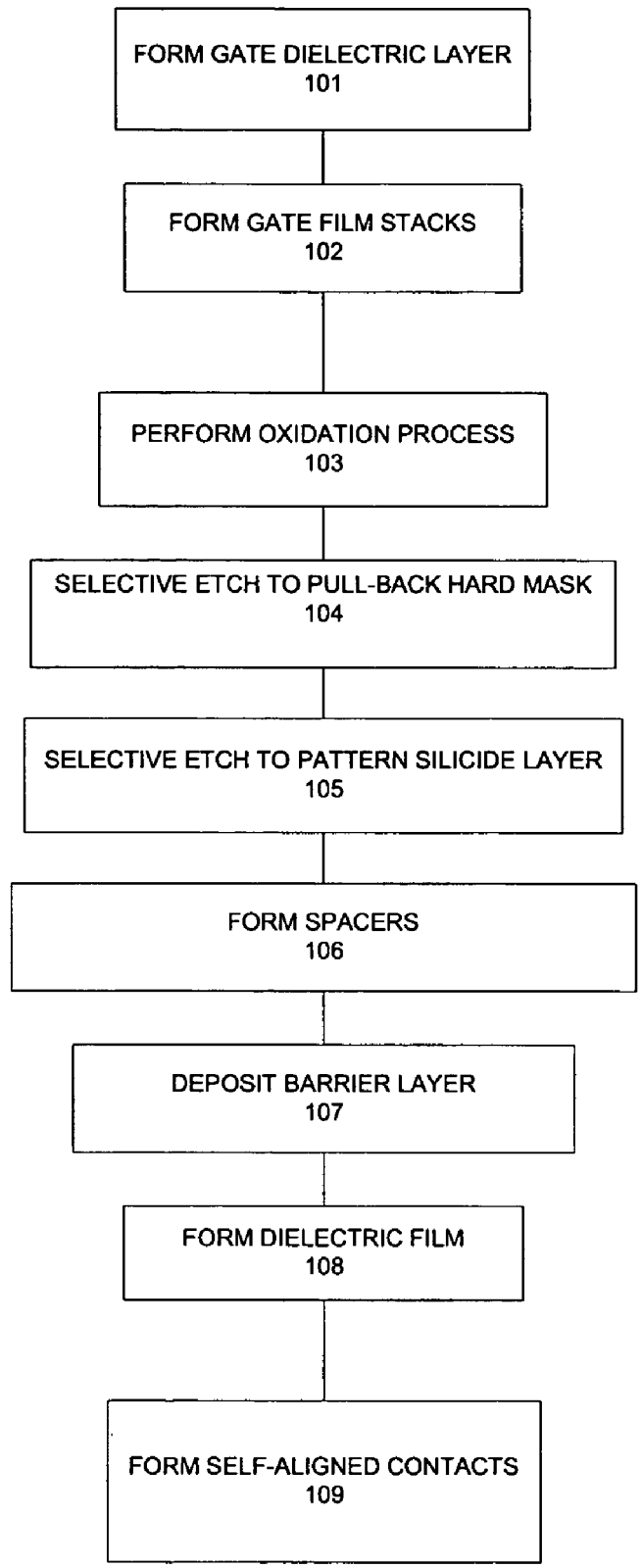
FIG. 1 illustrates a process for forming a CMOS structure having a void-free pre-metal dielectric film in accordance with an embodiment of the present invention.

FIG. 1 illustrates a process for forming a CMOS structure that includes a void-free dielectric film. First, as shown by step 101 a gate dielectric layer is formed over a semiconductor substrate. The gate dielectric layer can be formed by depositing or growing a thin layer (e.g., 10 to 80 Angstroms) of silicon dioxide ($SiO_2$), or other type of dielectric, on semiconductor substrate 2. Semiconductor substrate 2 can be either N or P type and can include isolation regions (e.g., using shallow trench isolation processing steps) or other device isolation structures, depending on the device requirements.

Referring now to step 102 gate film stacks are formed over the gate dielectric layer. In the present embodiment, adjoining gate film stacks are formed that include a hard mask and one or more underlying layers. In the present embodiment gate film stacks are formed that have a width of 1,400 Angstroms or less and have side surfaces that are approximately vertical. In this embodiment gate film stacks are identical and are closely spaced together, with adjoining gate film stacks separated by a distance of 2,000 Angstroms or less.

Figure 2:
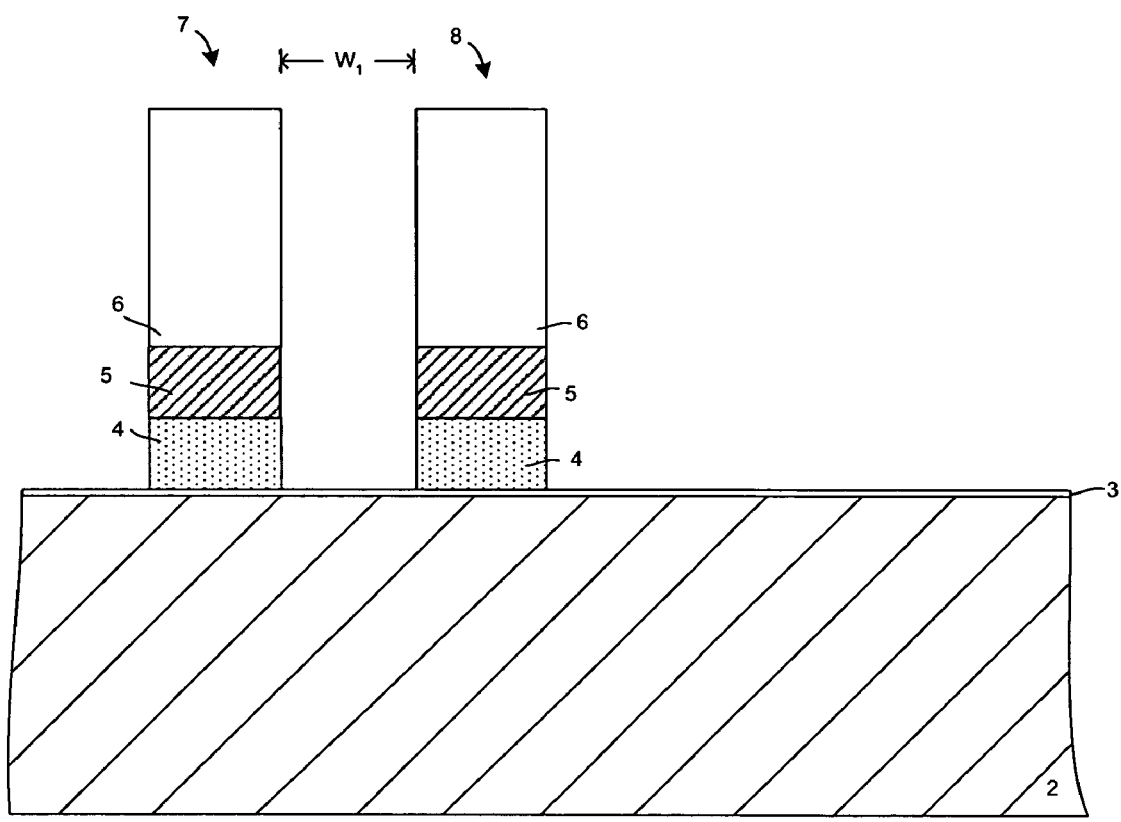
FIG. 2 shows a semiconductor substrate over which a dielectric layer and two gate film stacks have been formed in accordance with an embodiment of the present invention.

In the embodiment shown in FIG. 2, gate film stacks 7–8 are shown to be formed that include a polysilicon conductive layer 4, a silicide layer 5, and a hard mask 6. Conductive layer 4 includes one or more layers of conductive material that immediately overlie dielectric layer 3. In one embodiment conductive layer 4 has a thickness of from 500 to 2000 Angstroms. Conductive layer 4 can be formed by depositing one or more layers of polysilicon using a chemical vapor deposition process. Alternatively, conductive layer 4 can be formed by depositing amorphous silicon in a furnace. In the present embodiment conductive layer 4 is a single layer of polysilicon that is deposited using a chemical vapor deposition process, and that has a thickness of 650 Angstroms.

Continuing with FIG. 2, silicide layer 5 can be formed of one or more layers of refractory metal silicide, with individual layers formed of cobalt silicide, tungsten silicide, titanium silicide, tantalum silicide, molybdeum silicide, niobium silicide, rhenium silicide, vanadium silicide, chromium silicide, zirconium silicide or hafnium silicide. Silicide layer 5 can also be formed using non-refractory-metal suicides, or nonmetal suicides that have sufficient conductivity. In one embodiment silicide layer 5 is deposited using a Chemical Vapor Deposition (CVD) process and has a thickness of from 600 to 1,000 Angstroms. In the present embodiment silicide layer 5 is a single layer of tungsten silicide ($WSi_x$), that directly overlies conductive layer 4, and that has a thickness of approximately 650 Angstroms.

Hard mask 6 extends immediately over silicide layer 5 and can be formed of one or more layers of dielectric material. In one embodiment hard mask 6 is formed of a single layer of oxide ($SiO_2$), nitride (SiN) or oxynitride ($SiO_xN_y$) that has a thickness from 500 to 2,500 Angstroms. Alternatively, hard mask 6 can include multiple layers of material, with individual layers formed of oxide, nitride or oxynitride. Also, hard mask 6 can be formed using other dielectric materials that can be selectively etched relative to silicide layer 5. In the present embodiment hard mask 6 is a single layer of silicon nitride having a thickness of approximately 2,125 Angstroms.

As shown by step 103 of FIG. 1, a selective oxidation process is performed. The selective oxidation process can be performed by heating the structure shown in FIG. 2 in a high $H_2/H_2O$ ratio ambient, to a temperature of from 900 degrees Centigrade to 1200 degrees Centigrade, so that the oxidation of the tungsten silicide (silicide layer 5) is suppressed. In one embodiment the oxidation process is performed at a temperature of 900 degrees Centigrade for 4–20 seconds, in either oxygen gas ($O_2$) or in a wet anneal ($H_2O$) environment, using a rapid thermal anneal process. However, it is appreciated that the parameters of the oxidation process will vary depending on the desired thickness of the oxide regions that are formed.

Figure 3:
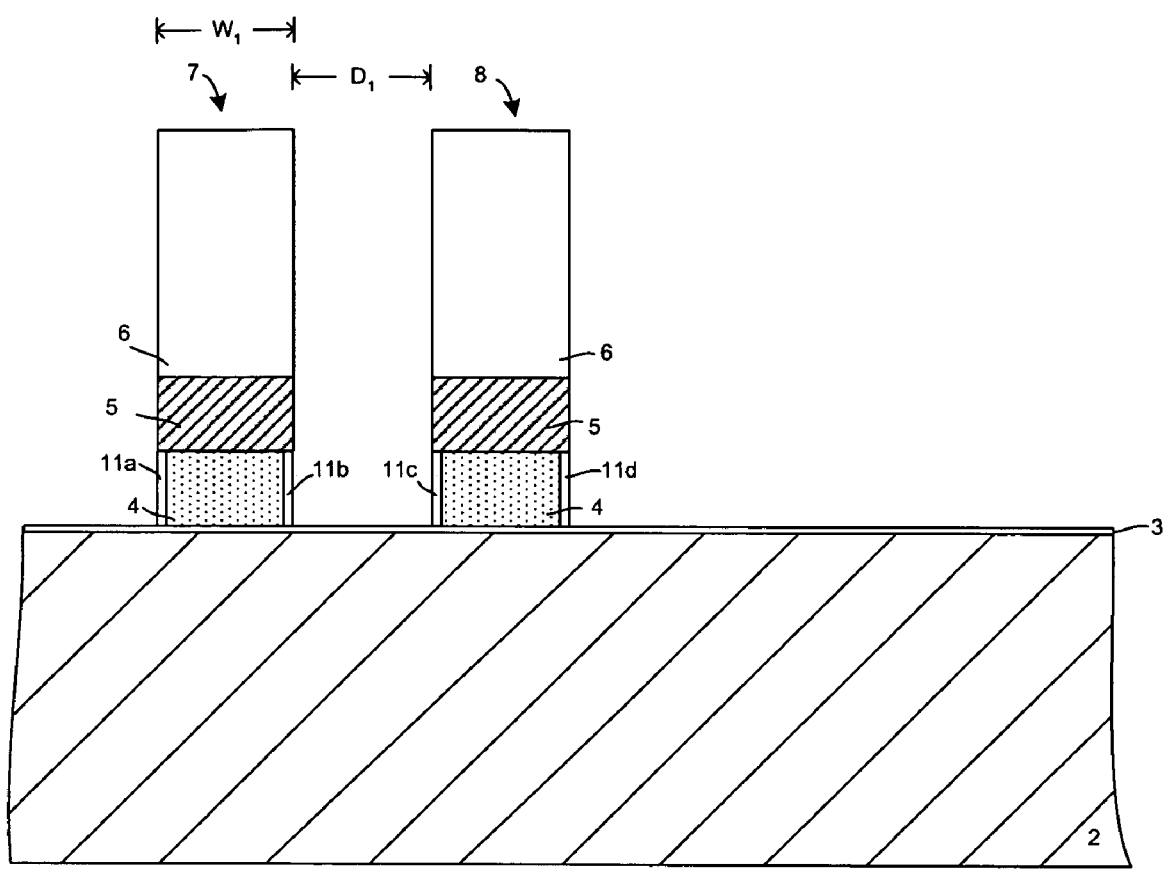
FIG. 3 shows the structure of FIG. 2 after a selective oxidation process has been performed in accordance with an embodiment of the present invention.

Referring now to FIG. 3, the oxidation process oxidizes the exposed surfaces of conductive layer 4, forming oxide regions 11a–11d within conductive layer 4. More particularly, oxidation region 11a–11b are formed in gate film stack 7, with oxidation region 11a formed within one side surface of conductive layer 4, and oxidation region 11b formed within the other side surface of conductive layer 4. Similarly, oxidation regions 11c–d are formed in gate film stack 8, with oxidation region 11c formed within one side surface of conductive layer 4, and oxidation region 11d formed within the other side surface of conductive layer 4. In the present embodiment oxidation regions 11a–d have a thickness of from 30 Angstroms to 100 Angstroms.

Figure 4:
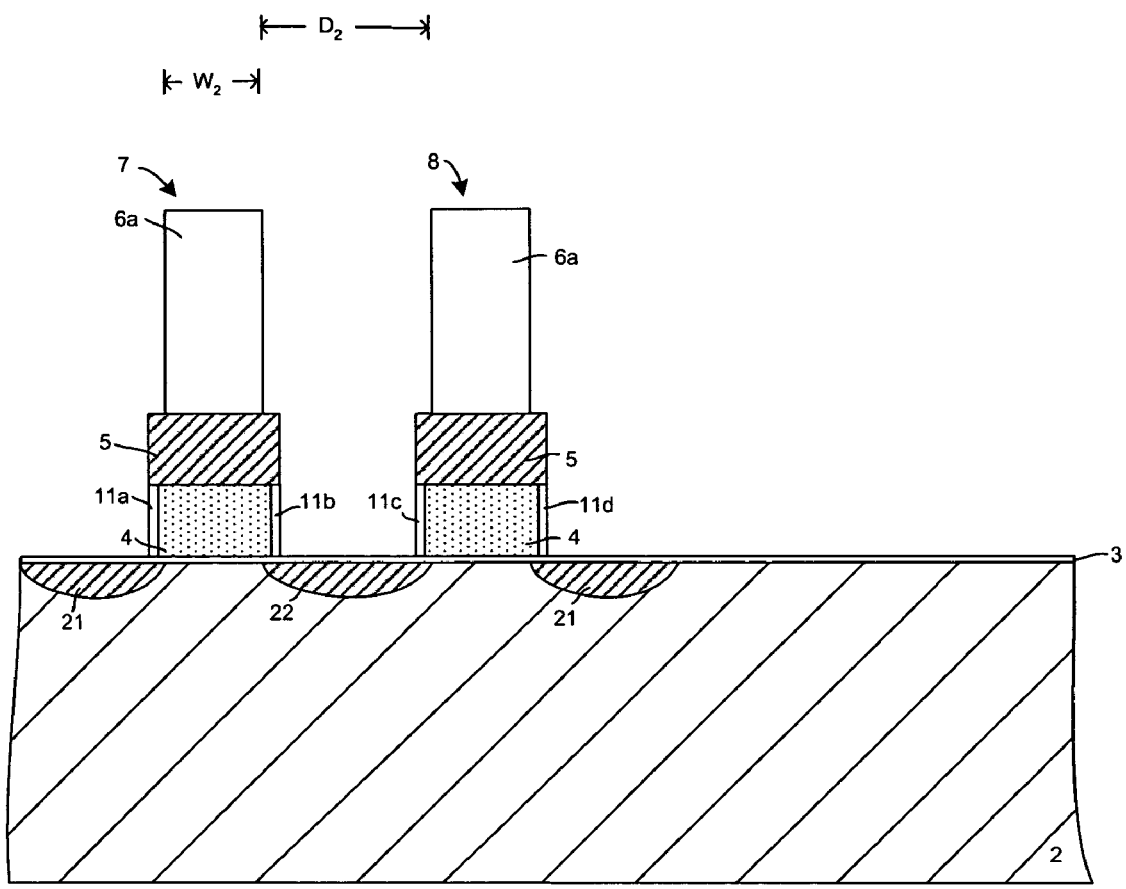
FIG. 4 shows the structure of FIG. 3 after an etch process has been performed so as to selectively remove some of the hard mask in accordance with an embodiment of the present invention.

Masking and implantation steps can be performed, either before or after oxidation process 103, so as to form source and drain regions 21–22. In the embodiment shown in FIG. 4, region 22 is a common source/drain region that extends between gate structures 7–8. However, alternatively, region 22 can include two separate and distinct source and/or drain regions.

Referring now to step 104, a selective etch is performed so as to etch the hard mask. This selective etch preferentially etches the hard mask over the silicide layer and the oxide regions. More particularly, etch step 104 selectively removes the material in the hard mask (e.g., silicon nitride), while only minimally etching the silicide layer and the oxide regions.

In one embodiment etch process 104 is a wet etch that is performed using a phosphoric acid etch solution, at a temperature of approximately 65 degrees Centigrade. When hard mask 6 is silicon nitride, the phosphoric acid etch solution can etch the silicon nitride at an etch rate of approximately 50 Angstroms per minute while not etching or minimally etching silicide layer 5 and oxide regions 11a–d. Since all of the exposed side surfaces of conductive layer 4 were oxidized in step 103, no portion of conductive layer 4 that has not been oxidized is exposed. Accordingly, oxide regions 11a–d protect conductive layer 4 from being damaged during etch process 104.

The selective etch process of step 104 will pull-back hard mask 6 over each of gate film stacks 7–8, decreasing the width of each hard mask 6 so as to form hard mask 6a. More particularly, etch process 104 proportionally decreases the lateral extent of each side of hard mask 6, so as to form a hard mask 6a, shown in FIG. 4, having a width that is less than the width of underlying silicide layer 5. This exposes a portion of the top surface of silicide layer 5. In one embodiment the width of hard mask 6 is reduced by approximately 200 angstroms on each side of hard mask 6 (giving a total decrease in width of 400 Angstroms), exposing approximately 200 angstroms on each side of the top surface of silicide layer 5.

Referring now to step 105, an etch process is performed so as pattern one or more layers of material that underlie the hard mask. In the present embodiment a selective etch process is used that will preferentially remove silicide layer 5 over the material in hard mask 6a. In one embodiment a fluorine based etch is performed in a poly-etch chamber that uses tetrafluoromethane ($CF_4$) and other fluorine-based chemistries. The etch chemistry is tuned (e.g., by altering ratios of etchant gasses and power) such that it will preferentially etch tungsten silicide (silicide layer 5a) over nitride (and/or oxide or oxynitride, depending on the composition of hard mask 6a). This will etch exposed portions of silicide layer 5a while not etching or minimally etching hard mask 6a, conductive layer 4, and oxide regions 11a–d.

Figure 5:
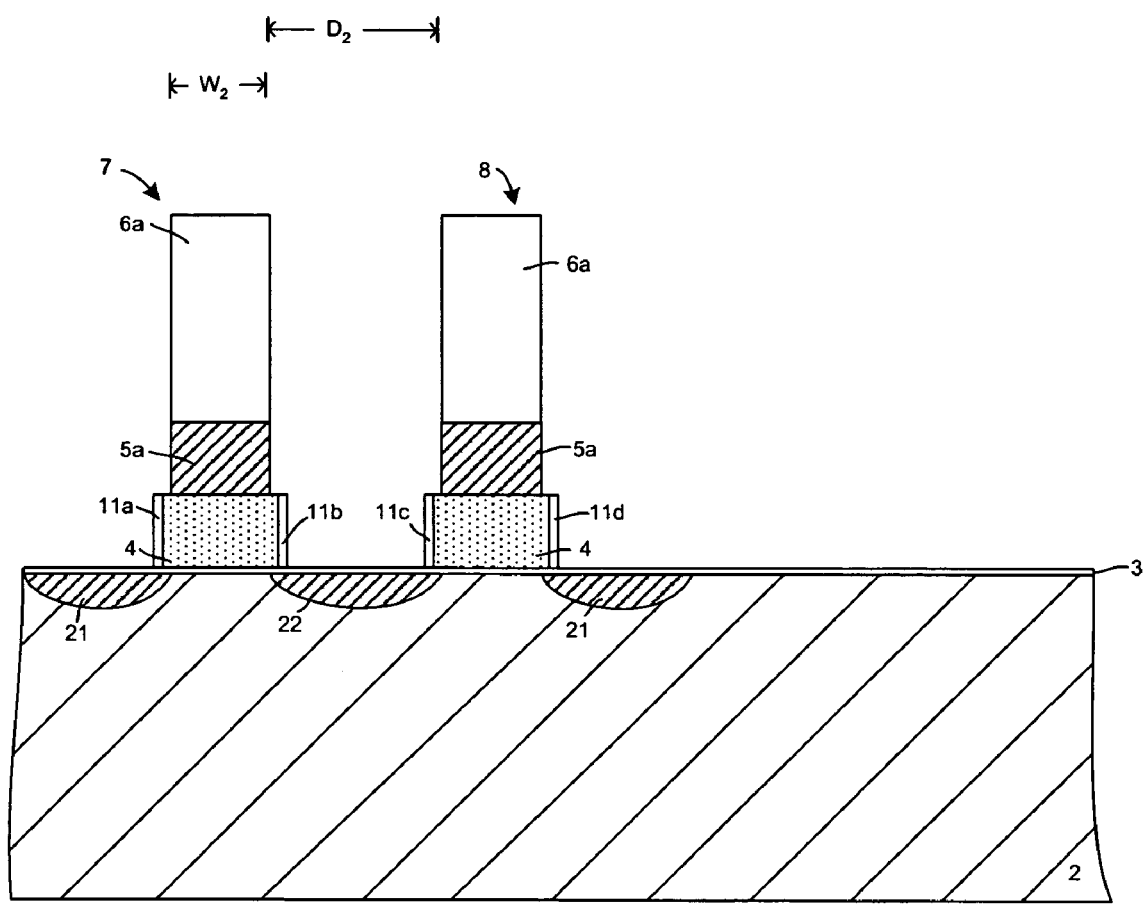
FIG. 5 shows the structure of FIG. 4 after an etch process has been performed so as to remove a portion of the silicide layer in accordance with an embodiment of the present invention.

In the embodiment shown in FIG. 5, etch process 105 is a selective etch process that preferentially removes silicide layer 5 over the material in hard mask 6a and conductive layer 4. In the present embodiment hard mask 6a serves as a masking structure, preventing removal of that portion of underlying silicide layer 5 that is covered by hard mask 6a. However, the etch will remove that portion of silicide layer 5 that is not covered by hard mask 6a forming silicide layer 5a. Silicide layer 5a has a reduced width $W_2$ as compared to the original width $W_1$ of silicide layer 5. After the removal of that portion of silicide layer 5 that is not covered by hard mask 6a, portions of the top surface of conductive layer 4 will be exposed. Accordingly, with little, if any, of hard mask 6a and conductive layer 4 are removed during the patterning of silicide layer 5. In one embodiment each gate film stack 7–8 has an initial width of approximately 1,400 Angstroms, and etch process 105 removes approximately 200 Angstroms from each side of silicide layer 5, giving a silicide layer 5a having a width of approximately 1,000 Angstroms.

Figure 6:
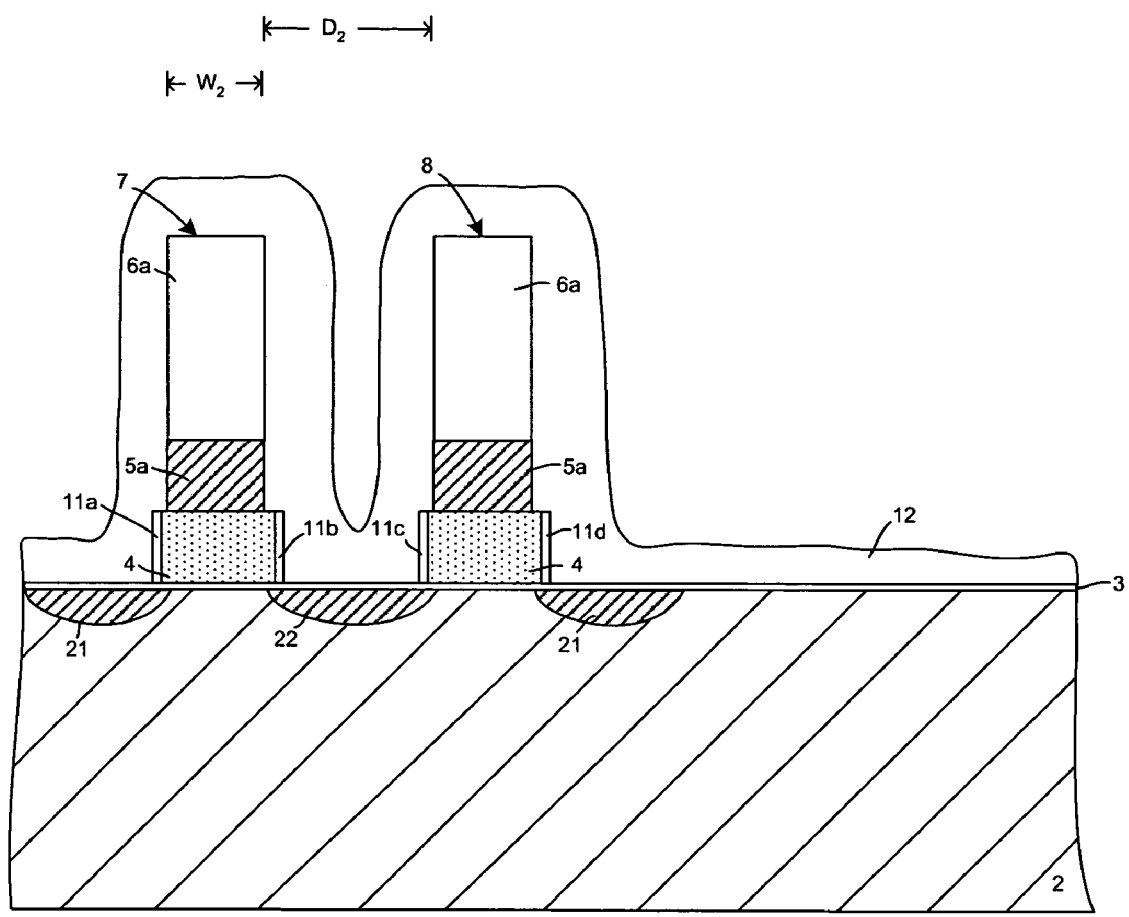
FIG. 6 shows the structure of FIG. 5 after a dielectric layer has been deposited thereover in accordance with an embodiment of the present invention.
Figure 7:
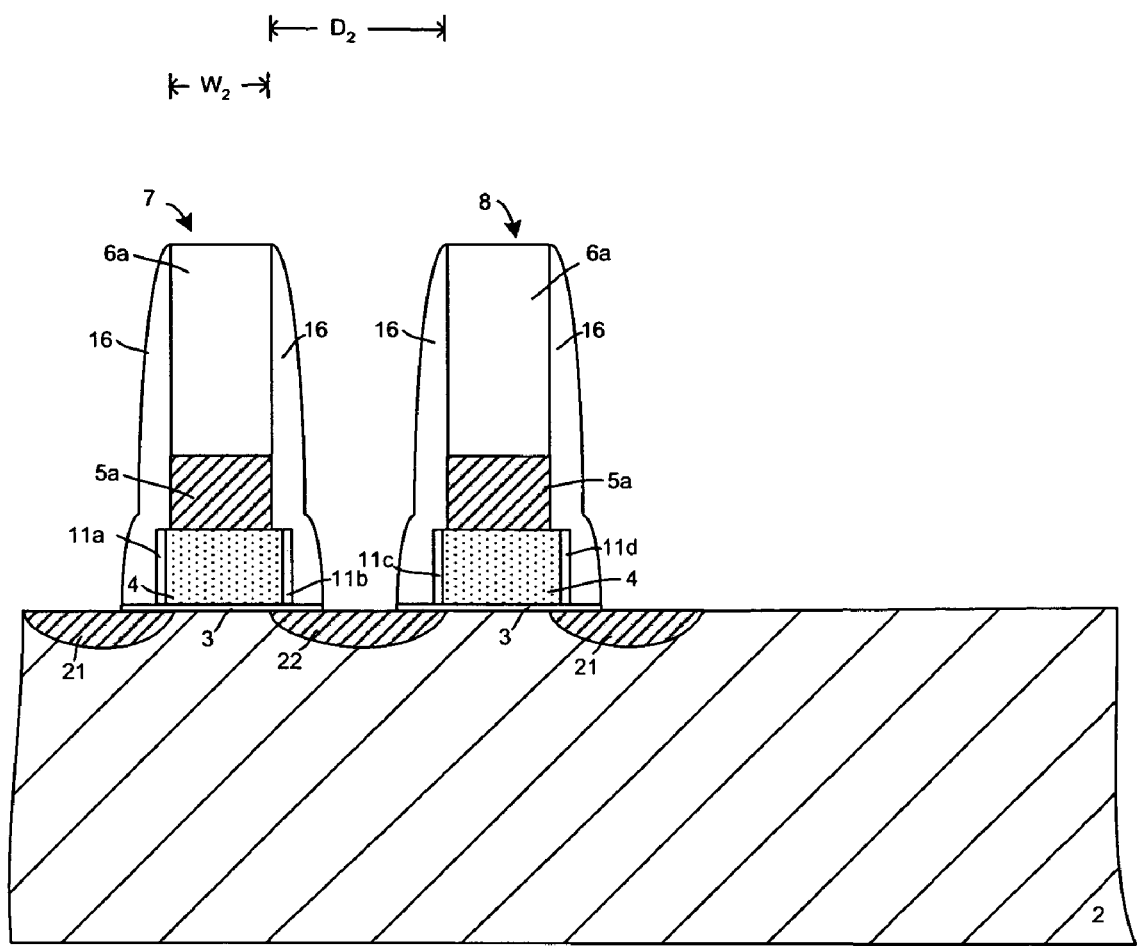
FIG. 7 shows the structure of FIG. 6 after an etch process has been performed to selectively remove a portion of the dielectric layer, forming dielectric spacers that extend on each side of each gate film stack in accordance with an embodiment of the present invention.

Spacers are formed as shown by step 106 of FIG. 1. In the embodiment shown in FIGS. 6–7 spacers 16 are formed that extend on opposite sides of each of gate film stacks 7–8. Spacers 16 can be formed by depositing one or more layers of dielectric material 12, and performing an reactive ion etch so as to form the structure shown in FIG. 7. In the present embodiment dielectric material 12 includes a thin oxide layer having a thickness of approximately 200 Angstroms that is deposited using a Plasma Enhanced Chemical Vapor Deposition (PECVD) process and a layer of silicon nitride (SiN) having a thickness of approximately 600 Angstroms that is deposited using a Low Pressure Chemical Vapor Deposition (LPCVD) process.

Referring now to step 107 a barrier layer is deposited. The term "barrier layer," as used in the present application includes any layer of dielectric material that can act as an etch stop relative to the material in pre-metal dielectric film 14, and specifically includes silicon nitride, silicon oxide, and silicon oxynitride.

Figure 8:
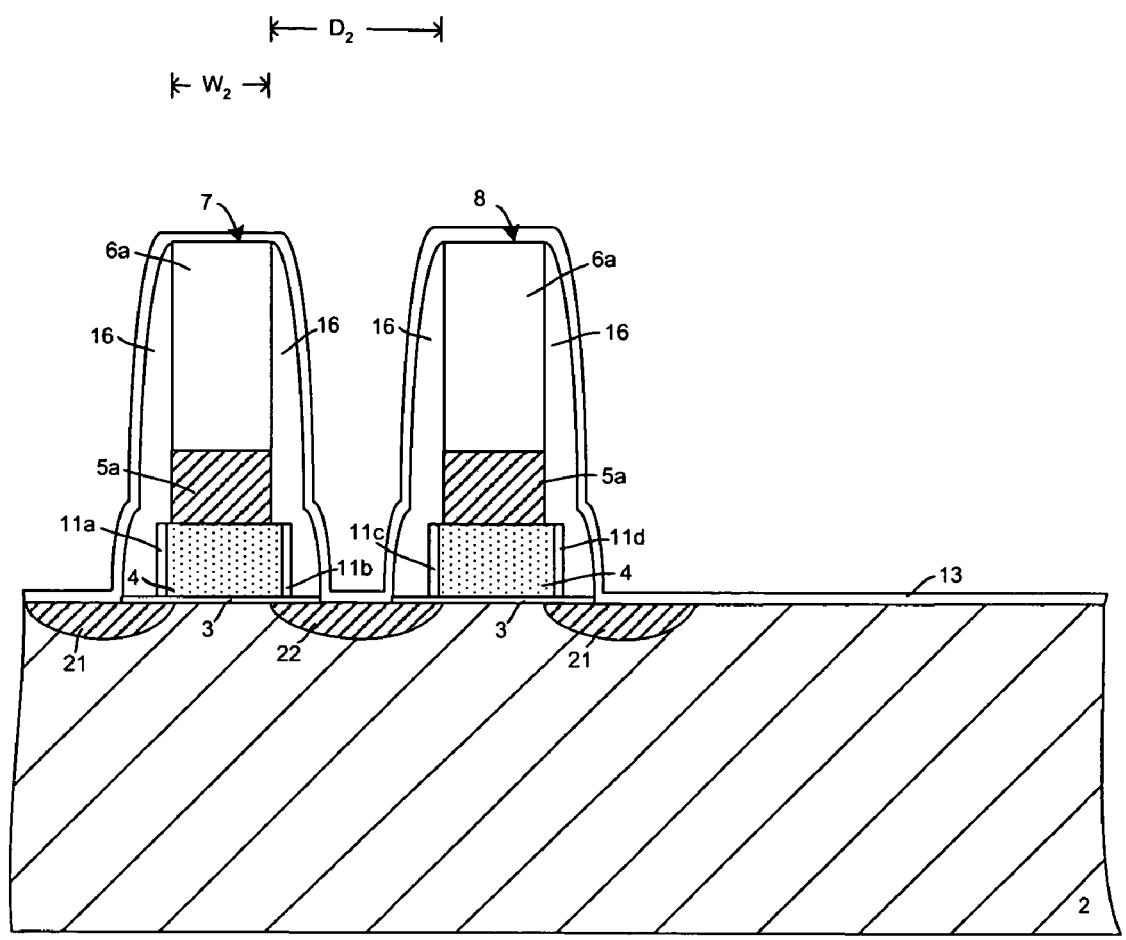
FIG. 8 shows a top view of the structure of FIG. 7 after a barrier layer has been deposited thereover in accordance with an embodiment of the present invention.
Figure 9:
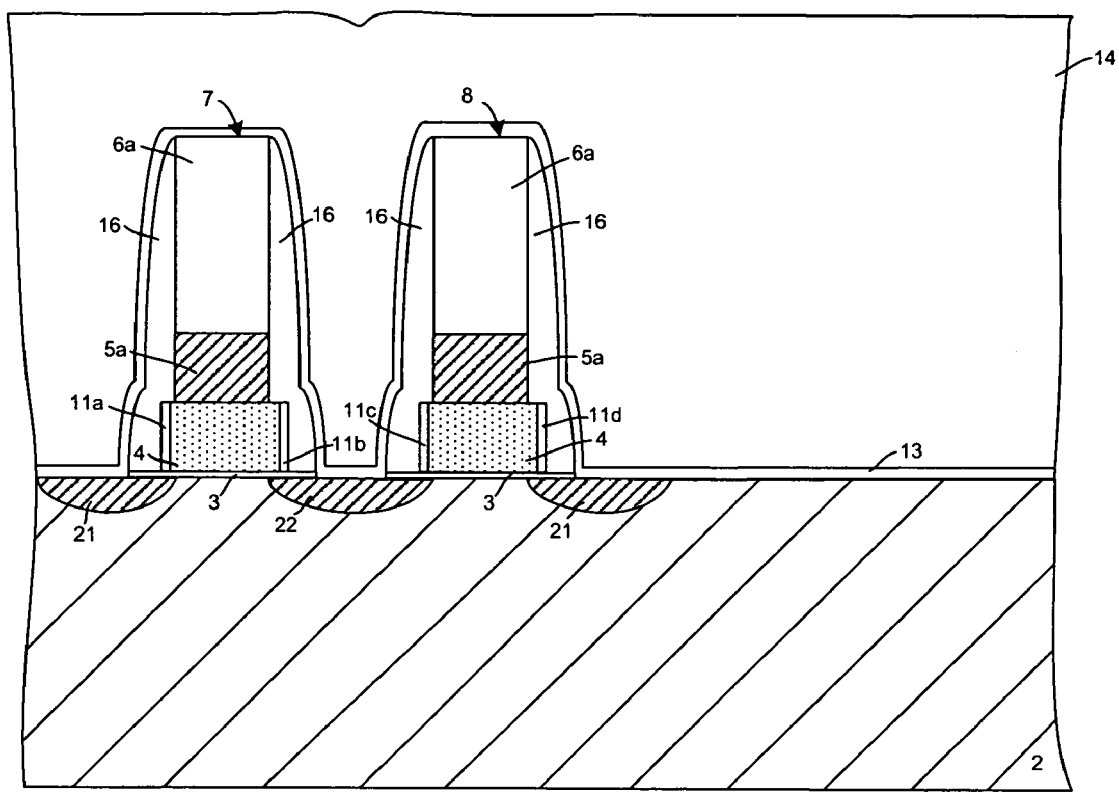
FIG. 9 shows the structure of FIG. 8 after a pre-metal dielectric film has been formed thereover in accordance with an embodiment of the present invention.

In the embodiment shown in FIG. 8, barrier layer 13 is shown to immediately overlie spacers 16 and the top surface of hard mask 6a. Barrier layer 13 can be one or more layers of dielectric material, with each layer formed of silicon nitride, silicon oxide, silicon oxynitride, or other dielectric material that can act as an etch stop relative to the material in pre-metal dielectric film 14. In the present embodiment barrier layer 13 is formed by depositing a single layer of silicon nitride (SiN), having a thickness of approximately 200 Angstroms.

Referring now to step 108 of FIG. 1, a pre-metal dielectric film 14 is formed. In the present embodiment dielectric film 14 extends over the entire semiconductor substrate and has a thickness such that it extends from 1,000 to 15,000 Angstroms over the top of gate film stacks 7–8. Pre-metal dielectric film 14 can be one or more layers of dielectric material, with each layer formed of doped oxide, borophosphosilica glass (BPSG), undoped silica glass (USG), spin on glass(SOG), borosilica glass (BSG), phosphosilicate glass (PSG) or tetraethylorthosilicate (TEOS), oxynitride or other dielectric material that can be selectively etched relative to the material in barrier layer 13.

In one specific embodiment a pre-metal dielectric film 14 is formed that has a hard, planar upper surface. In this embodiment one or more layers of soft conformal dielectric material such as doped oxide, BPSG, USG, BSG, PSG or some combination of these materials, are deposited to form a dielectric film that is planarized using a chemical mechanical polishing process. One or more layers of relatively hard dielectric material such as TEOS and/or silicon oxynitride are then deposited to form the hard upper surface.

As the process of the present invention reduces the width ($W_1$) of hard mask layer 6 and silicide layer 5, the profile of each gate film stack 7–8 has reduced width ($W_2$) near the top of each gate film stack 7–8 as compared to the width ($W_1$) at the bottom of each gate film stack 7–8. The resulting profile includes layers 5–6 that are recessed relative to the bottom conductive layer, giving an opening between adjoining structures (that is to be filled by dielectric film) that is sloped at an angle that is less than ninety degrees. In the present embodiment, a slope that is from 70 to 80 degrees is obtained. Accordingly, the opening is much easier to fill than openings of prior art processes in which the gate film stacks have vertical sidewalls. Therefore, the present invention prevents voids from forming in the dielectric film, preventing the occurrence of bridging defects.

Self aligned contacts are formed as shown by step 109 of FIG. 1. In the embodimant shown in FIG. 10, self-aligned contact 15 is formed by performing a selective etch process to form self-aligned contact openings that are then filled with conductive material to form self-aligned contacts. In the present embodiment a two step etch process is used to form self-aligned contact openings. The first etch process is a selective etch that etches through pre-metal dielectric film 14 and stops on barrier layer 13. In the present embodiment this first etch uses fluorine based chemistry (e.g., $C_4F_8$, $C_5F_8$, $C_2HF_5$) that is tuned to obtain a high etch rate of oxide (pre-metal dielectric film 14) and a low etch rate of silicon nitride (barrier layer 13 and hard mask 6a). A second selective etch process is then used to extend the opening through barrier layer 13 and gate dielectric layer 3. The second etch can be a highly selective dry etch that preferentially etches barrier layer 13 while minimally etching pre-metal dielectric film 14. In one embodiment, a dry etch is used (for example, a dry etch that uses $CHF_3$ and $O_2$, $CH_3F$) that is tuned to obtain a high etch rate of silicon nitride and a low etch rate of oxide so as to remove the exposed portion of barrier layer 13, while only minimally removing material from pre-metal dielectric film 14. The etch process for forming self-aligned contact openings preferentially etches the material in pre-metal dielectric layer 14 over the material in spacer 16 and barrier layer 13, aligning the self-aligned contact opening with the region of substrate 2 that extends between gate film stack 7 and gate film stack 8 such that contact 15 is a self-aligned contact.

Figure 10:
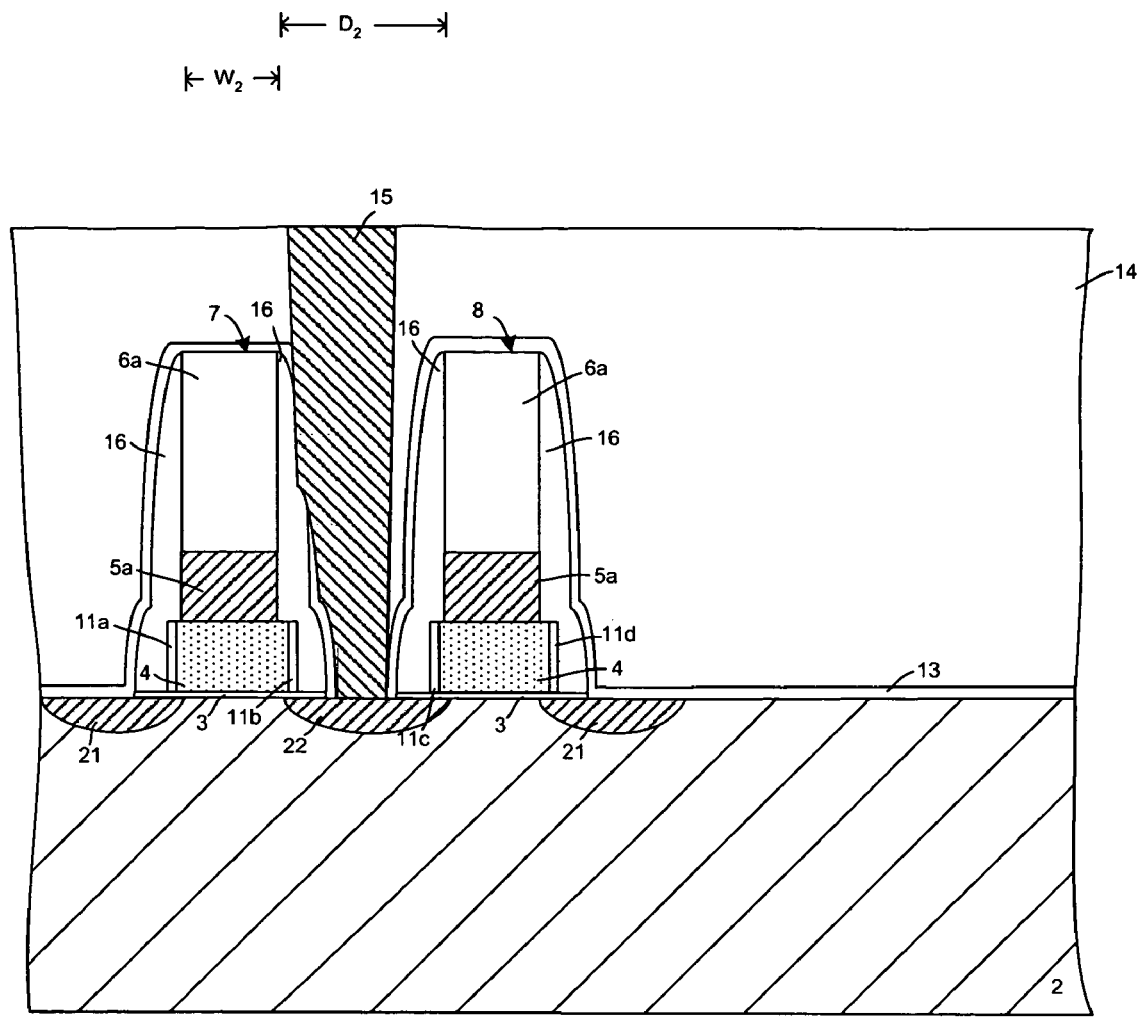
FIG. 10 shows the structure of FIG. 9 after a self-aligned contact has been formed that extends through the pre-metal dielectric film, through the barrier layer, and through the gate dielectric layer in accordance with an embodiment of the present invention.

The self-aligned contact openings are then filled with conductive material that is then planarized using a chemical mechanical polishing process so as to form self-aligned contact 15 shown in FIG. 10.

In one specific embodiment, conductive layer 4 has a thickness of approximately 600 Angstroms and a width of approximately 1,400 Angstroms; and tungsten silicide layer 5 has a thickness of 650 Angstroms; and silicon nitride layer 6 has a thickness of approximately 2125 Angstroms; and the space between adjoining gate film stacks is approximately 2,000 Angstroms. In this embodiment the distance between adjoining polysilicon conductive layers 4 is from 0.1 micron to 0.3 micron. With spacers having a width of 800 Angstroms, this leaves a space of less than 400 Angstroms between adjoining structures. However, as the process of the present invention reduces the width of the hard mask layer and the silicide layer so as to form gate film stack structures that have reduced width near the top of each gate film stack as compared to the width at the bottom of the gate film stack, the space between adjoining gate film stacks that is to be filled by dielectric film is much easier to fill than that of prior art processes in which the gate film stacks have vertical sidewalls. Accordingly, the present invention prevents voids from forming in the dielectric film, preventing the occurrence of bridging defects that can result from voids in the dielectric film.

The preferred embodiment of the present invention is thus described. While the present invention has been described in particular embodiments, it should be appreciated that the present invention should not be construed as limited by such embodiments, but rather construed according to the following claims.

What is claimed is:

1. For a Complimentary Metal Oxide Semiconductor (CMOS) device that has adjoining gate film stacks that include a hard mask and a plurality of underlying layers, a process for forming a void-free dielectric layer comprising:
    performing a first selective etch so as to reduce the width of said hard mask on each of said gate film stacks, said first selective etch exposing a top surface of one of said underlying layers;
    performing a second selective etch using said reduced-width hard mask as an etch mask so as to reduce the width of at least one of said underlying layers; and
    forming a dielectric film over said gate film stacks such that said dielectric film fills at least some of the space between said gate film stacks.

2. The process of claim 1 wherein said underlying layers comprise a silicide layer that underlies said hard mask.

3. The process of claim 2 wherein said underlying layers comprise a polysilicon layer that underlies said silicide layer.

4. The process of claim 3 further comprising:
    performing an oxidation process prior to performing said first selective etch, said oxidation process forming oxidized regions in each side surface of said polysilicon layer.

5. The process of claim 1 wherein said gate film stacks have side surfaces that are approximately vertical prior to said performing a first selective etch.

6. The process of claim 1 wherein said hard mask on each of said adjoining gate film stacks has a first width prior to said first selective etch and wherein said hard mask has a second width after said first selective etch, said second width less than ninety percent of said first width.

7. The process of claim 1 further comprising:
    forming spacers that extend between said adjoining gate film stacks;
    forming a barrier layer over said spacers prior to said forming a dielectric film, said dielectric film filling that portion of the space between said gate film stacks that extends above said barrier layer; and
    forming a self aligned contact that extends through said dielectric film and said barrier layer, and that extends between said gate film stacks.

8. The process of claim 2 wherein said hard mask on each of said adjoining gate film stacks has a first width prior to said first selective etch and a second width after said first selective etch, and further wherein said silicide layer on each of said adjoining gate film stacks has a width that is approximately equal to said first width prior to said second selective etch and wherein said silicide layer has a width after said second selective etch that is approximately equal to said second width.

9. A process for forming a void-free dielectric layer comprising:
    forming adjoining gate film stacks on a semiconductor substrate, each of said gate film stacks including a silicide layer and a hard mask that overlies said silicide layer;
    performing a first selective etch so as to reduce the width of said hard mask on each of said gate film stacks, said first selective etch exposing portions of a top surface of said silicide layer;
    performing a second selective etch, using said reduced-width hard mask as an etch mask to pattern said silicide layer, said second selective etch forming a reduced-width silicide layer on each of said adjoining gate film stacks, said reduced-width silicide layer having approximately the same width as said reduced-width hard mask;
    forming spacers on opposite sides of each of said gate film stacks; and
    forming a dielectric film that extends over said gate film stacks.

10. The process of claim 9 wherein said first selective etch preferentially etches said hard mask over said silicide layer.

11. The process of claim 10 wherein said second selective etch preferentially etches said silicide layer over said hard mask.

12. The process of claim 9 wherein each of said gate film stacks includes a conductive layer that is disposed immediately below said silicide layer.

13. The process of claim 12 wherein said conductive layer comprises a polysilicon layer, said process further comprising:
    performing an oxidation process prior to performing said first selective etch so as to oxidize exposed surfaces of said polysilicon layer.

14. The process of claim 11 wherein said hard mask comprises a material selected from the group consisting of silicon nitride, silicon oxide and silicon oxynitride.

15. The process of claim 9 wherein source and drain regions are formed in said semiconductor substrate, said method further comprising:
    forming a barrier layer over said spacers prior to said forming a dielectric film, such that said dielectric film overlies said barrier layer; and
    forming a self aligned contact that extends through said dielectric film and said barrier layer so as to contact one or more of said source and drain regions that extend between said gate film stacks.

16. For a Complimentary Metal Oxide Semiconductor (CMOS) device that has adjoining gate film stacks that include a hard mask, and a plurality of underlying layers that include a polysilicon layer, a process for forming a void-free dielectric layer comprising:
    performing an oxidation process to form oxidized regions in each side surface of said polysilicon layer;
    performing a first selective etch, after said performing an oxidation process, so as to reduce the width of said hard mask on each of said gate film stacks, said first selective etch exposing a top surface of one of said underlying layers;

performing a second selective etch so as to reduce the width of at least one of said underlying layers; and forming a dielectric film over said gate film stacks such that said dielectric film fills at least some of the space between said gate film stacks.

17. The process of claim 16 wherein said underlying layers comprise a silicide layer that extends between said hard mask and said polysilicon layer, said second selective etch reducing the width of said silicide layer.

18. The process of claim 17 wherein said hard mask on each of said adjoining gate film stacks has a first width prior to said first selective etch and a second width after said first selective etch, and further wherein said silicide layer on each of said adjoining gate film stacks has a width that is approximately equal to said first width prior to said second selective etch and a width after said second selective etch that is approximately equal to said second width.

19. The process of claim 16 wherein said hard mask comprises a material selected from the group consisting of silicon nitride, silicon oxide and silicon oxynitride.

20. The process of claim 16 further comprising:

forming spacers that extend between said adjoining gate film stacks;

forming a barrier layer over said spacers prior to said forming a dielectric film, said dielectric film filling that portion of the space between said gate film stacks that extends above said barrier layer; and forming a self aligned contact that extends between said gate film stacks, and that extends through said dielectric film and said barrier layer.

* * * * *

UNITED STATES PATENT AND TRADEMARK OFFICE
CERTIFICATE OF CORRECTION

| | |
|---|---|
| PATENT NO. | : 7,163,881 B1 |
| APPLICATION NO. | : 10/863533 |
| DATED | : January 16, 2007 |
| INVENTOR(S) | : Chen et al. |

It is certified that error appears in the above-identified patent and that said Letters Patent is hereby corrected as shown below:

Column 3, line 49, both occurrences of the word "suicides" should read --silicides--.

Signed and Sealed this

Twenty-seventh Day of March, 2007

JON W. DUDAS
*Director of the United States Patent and Trademark Office*